(12) United States Patent
Zhou et al.

(10) Patent No.: US 12,517,537 B2
(45) Date of Patent: Jan. 6, 2026

(54) LDO POWER SUPPLY CIRCUIT AND POWER AMPLIFIER

(71) Applicant: LANSUS TECHNOLOGIES INC., Shenzhen (CN)

(72) Inventors: Yongfeng Zhou, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 431 days.

(21) Appl. No.: 18/132,424

(22) Filed: Apr. 10, 2023

(65) Prior Publication Data

US 2023/0305586 A1    Sep. 28, 2023

Related U.S. Application Data

(63) Continuation of application No. PCT/CN2022/084440, filed on Mar. 31, 2022.

(30) Foreign Application Priority Data

Dec. 31, 2021    (CN) .......................... 202111683179.1

(51) Int. Cl.
  *G05F 1/59*     (2006.01)
  *G05F 1/575*    (2006.01)
  *H03F 3/21*     (2006.01)

(52) U.S. Cl.
  CPC ............... *G05F 1/59* (2013.01); *G05F 1/575* (2013.01); *H03F 3/21* (2013.01); *H03F 2200/222* (2013.01); *H03F 2200/387* (2013.01)

(58) Field of Classification Search
  CPC ... G05F 1/59; G05F 1/575; G05F 1/56; H03F 3/21; H03F 2200/222; H03F 2200/387;
(Continued)

(56) References Cited

U.S. PATENT DOCUMENTS

| 6,765,374 B1 | 7/2004 | Yang et al. |
| 2013/0002220 A1 | 1/2013 | Terada |
| 2018/0120881 A1 | 5/2018 | Gebeyehu |

FOREIGN PATENT DOCUMENTS

| CN | 102722207 A | 10/2012 |
| CN | 104950975 4 | 9/2015 |

(Continued)

OTHER PUBLICATIONS

Japanese Notice of Reasons for Refusal, Japanese Patent Application No. 2023-536506, mailed Jul. 26, 2024. (6 pages).

(Continued)

*Primary Examiner* — Andrea Lindgren Baltzell
*Assistant Examiner* — Jose E Pinero

(57) ABSTRACT

An LDO power supply circuit includes an operational amplifier, a first transistor, and a resistance feedback network including a first branch and a second branch. A negative electrode input end of the operational amplifier connects a control voltage. An output end of the operational amplifier connects a gate electrode of the first transistor. A source electrode of the first transistor connects a power supply voltage. A positive electrode input end of the operational amplifier and a drain electrode of the first transistor are respectively an input end and an output end of the LDO power supply circuit. The resistance feedback network connects between the drain electrode of the first transistor and the positive electrode input end of the operational amplifier. A first feedback coefficient formed by the first branch is different from a second feedback coefficient formed by the second branch. The present disclosure further provides a power amplifier.

9 Claims, 6 Drawing Sheets

(58) Field of Classification Search
CPC .......... H03F 3/193; H03F 3/211; H03F 3/245; H03F 2200/108; H03F 2200/18; H03F 2200/301; H03F 2200/42; H03F 2200/451; H03F 2200/75; H03F 1/223; H03F 1/0227; H03F 1/56
USPC ........................................................ 330/291
See application file for complete search history.

(56) References Cited

FOREIGN PATENT DOCUMENTS

| CN | 105242736 | A |   | 1/2016  |             |
|----|-----------|---|---|---------|-------------|
| CN | 105408829 | A |   | 3/2016  |             |
| CN | 105425888 |   |   | 3/2016  |             |
| CN | 106227282 | A | * | 12/2016 | ... G05F 1/561 |
| CN | 110320963 | A |   | 10/2018 |             |
| CN | 110808717 | A | * | 2/2020  | ... H03F 1/301 |
| CN | 113268102 | A |   | 8/2021  |             |
| JP | 2014048681| A |   | 3/2014  |             |
| WO | 2019161655| A1|   | 8/2019  |             |

OTHER PUBLICATIONS

European Search Report, European Application No. 22871162.8, mailed Mar. 26, 2024. (14 pages).

International Search Report issued In corresponding Inte tional application No. PCT/CN2022/084440, mailed Sep. 27, 2022(6 pages).

Written Opinion of the International Search Authority in corresponding International application No. PCT/CN2022/084440, mailed Sep. 27, 2022(6 pages).

Korea Office Action issued for Application No. 10-2023-7022094, mailed Aug. 14, 2025 (16 pages).

* cited by examiner

LDO POWER SUPPLY CIRCUIT AND POWER AMPLIFIER

TECHNICAL FIELD

The present disclosure relates to a technical field of radio frequency communications, and in particular to a low dropout regulator (LDO) power supply circuit and a power amplifier.

BACKGROUND

At present, power control methods of a power amplifier includes a current control method and a voltage control method.

A current control technology, also known as a base electrode control technology, is a closed-loop control. By detecting a current output from an output end of the power amplifier, the current output from the output end of the power amplifier is input to a feedback end of a low dropout regulator (LDO) power supply circuit, and is combined with a control voltage Vramp, then a power control of the power amplifier is realized by adjusting a bias current of the power amplifier.

A voltage control technology is also known as a collector electrode control technology. The control voltage Vramp controls a voltage of the LDO power supply circuit. The LDO power supply circuit provides power for the power amplifier.

In the prior art, when the power amplifier is controlled by the control voltage Vramp, regardless of whether the voltage control method or the current control method is used, a switching spectrum of the power amplifier is greatly affected by a rising slope of the control voltage Vramp and a falling slope of the control voltage Vramp, so a slope of the control voltage Vramp needs to be controlled to obtain a good switching spectrum performance of the power amplifier.

Therefore, it is necessary to provide an LDO power supply circuit and a new power amplifier to solve the above problems in the prior art.

SUMMARY

In view of the above technical problems in the prior art, the present disclosure provides a low dropout regulator (LDO) power supply circuit and a power amplifier with a good switching spectrum performance.

In order to solve the above technical problems in the prior art, in a first aspect, embodiments of the present disclosure provide the LDO power supply circuit including an operational amplifier, a first transistor, and a resistance feedback network.

A negative electrode input end of the operational amplifier is configured to connect a control voltage. A positive electrode input end of the operational amplifier is an input end of the LDO power supply circuit. An output end of the operational amplifier is connected to a gate electrode of the first transistor.

A source electrode of the first transistor is configured to connect a power supply voltage. A drain electrode of the first transistor is an output end of the LDO power supply circuit.

The resistance feedback network is connected between the drain electrode of the first transistor and the positive electrode input end of the operational amplifier. The resistance feedback network includes a first branch and a second branch. The first branch and the second branch are connected in parallel. The first branch forms a first feedback coefficient, the second branch forms a second feedback coefficient, and the first feedback coefficient is different from the second feedback coefficient.

Optionally, the resistance feedback network includes a first resistance, a second resistance, a third resistance, and a second transistor.

A first end of the first resistance is connected to the drain electrode of the first transistor. A second end of the first resistance is connected to the positive electrode input end of the operational amplifier.

A first end of the second resistance is connected to the second end of the first resistance. A second end of the second resistance is grounded.

A first end of the third resistance is connected to the second end of the first resistance. A second end of the third resistance is connected to a drain electrode of the second transistor.

A gate electrode of the second transistor is configured to connect the control voltage. A source electrode of the second transistor is grounded.

The first resistance and the second resistance jointly form the first branch. The first resistance, the third resistance, and the second transistor jointly form the second branch.

Optionally, the first transistor is a positive channel metal oxide semiconductor (PMOS) transistor, and the second transistor is an N-Metal-Oxide-Semiconductor (NMOS) transistor.

Optionally, the LDO power supply circuit further includes a voltage stabilizing capacitor. A first end of the voltage stabilizing capacitor is connected to the drain electrode of the first transistor. A second end of the voltage stabilizing capacitor is grounded.

In a second aspect, the embodiments of the present disclosure further provide a power amplifier including a bias circuit, an input end of the power amplifier, an input matching circuit, a power amplifier unit, an output matching circuit, and an output end of the power amplifier. The input end of the power amplifier, the input matching circuit, the power amplifier unit, the output matching circuit, and the output end of the power amplifier are connected in sequence. An output end of the bias circuit is connected to an input end of the power amplifier unit. The power amplifier further includes the LDO power supply circuit provided by the present disclosure. The input end of the LDO power supply circuit is connected to the input end of the power amplifier unit. The output end of the LDO power supply circuit is connected to an input end of the bias circuit to form a current feedback control of the power amplifier unit.

Optionally, the power amplifier further includes a choke inductor. A first end of the choke inductor is connected to the power supply voltage. A second end of the choke inductor is connected to an output end of the power amplifier unit.

In a third aspect, the embodiments of the present disclosure further provide a power amplifier including a bias circuit, an input end of the power amplifier, an input matching circuit, a power amplifier unit, an output matching circuit, and an output end of the power amplifier. The input end of the power amplifier, the input matching circuit, the power amplifier unit, the output matching circuit, and the output end of the power amplifier are connected in sequence. The output end of the bias circuit is connected to the input end of the power amplifier unit. The input end of the bias circuit is connected to the power supply voltage. The power amplifier further includes the LDO power supply circuit provided by the present disclosure. The output end of the LDO power supply circuit is connected to the output end of the power amplifier unit to form a voltage feedback control of the power amplifier unit.

Optionally, the power amplifier further includes the choke inductor. The output end of the LDO power supply circuit is connected in series with the choke inductor, the output end of the LDO power supply circuit is connected to the output end of the power amplifier unit.

Optionally, a third transistor, a fourth transistor, and a fifth transistor are connected in parallel to form the power amplifier unit.

Optionally, the power amplifier unit is an N-type power amplifier triode.

Compared with the prior art, the present disclosure provides the LDO power supply circuit and the power amplifier, in which the resistance feedback network is connected between the drain electrode of the first transistor and the positive electrode input end of the operational amplifier in the LDO power supply circuit. The resistance feedback network includes the first branch and the second branch, and the first branch and the second branch are connected in parallel. The first branch forms the first feedback coefficient. The second branch forms the second feedback coefficient. The first feedback coefficient is different from the second feedback coefficient. By adopting a combination of the first feedback coefficient and the second feedback coefficient, a rising slope of an output voltage $V_{LDO}$ of the LDO power supply circuit is improved, thereby effectively improving the switching spectrum performance of the power amplifier applying the LDO power supply circuit.

BRIEF DESCRIPTION OF DRAWINGS

The present disclosure will be described in detail below with reference to the accompanying drawings. The above or other aspects of the present disclosure will be more clearly and more readily understood by reference to following detailed description of the accompanying drawings. In the drawings.

DETAILED DESCRIPTION OF EMBODIMENTS

The embodiments of the present disclosure are further described below with reference to the accompanying drawings.

Specific embodiments described herein are the specific embodiments of the present disclosure, which are used to illustrate concepts of the present disclosure and are explanatory and exemplary, and should not be construed as being limited to the embodiments of the present disclosure and protection scope of the present disclosure set forth herein. Except for the embodiments described herein, a person of ordinary skill in the art may also adopt other obvious technical solutions based on contents of claims and specification disclosed in the present disclosure, the technical solutions include any obvious replacement and modification technical solutions adopting the embodiments described herein, which are all within the protection scope of the present disclosure.

Following description of the embodiments is provided with reference to the accompanying drawings, and is used to illustrate specific embodiments that can be implemented by the present disclosure. Directional terms mentioned in the present disclosure, for example, up, down, front, rear, left, right, inside, outside, and side surfaces, etc., are merely directions referring to the accompanying drawings. Therefore, the directional terms used herein are used to illustrate and understand the present disclosure, but are not intended to limit the present disclosure.

Figure 1:
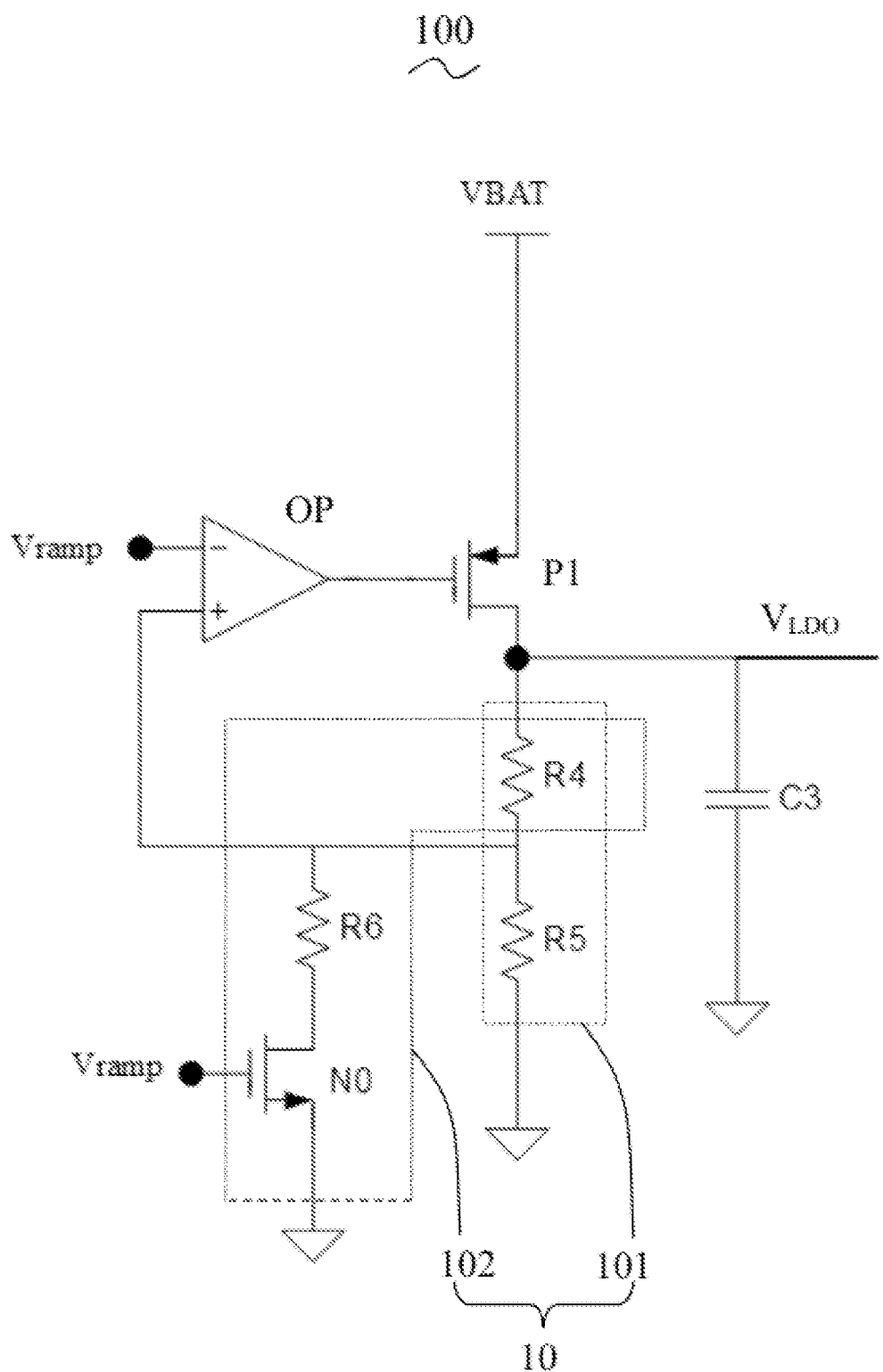
FIG. 1 is a circuit diagram of a low dropout regulator (LDO) power supply circuit according to one embodiment of the present disclosure.

Please refer to FIG. 1, which is a circuit diagram of a low dropout regulator (LDO) power supply circuit according to one embodiment of the present disclosure, the present disclosure provides the LDO power supply circuit 100 including an operational amplifier OP, a first transistor P1, and a resistance feedback network 10.

A negative electrode input end of the operational amplifier OP is configured to connect a control voltage Vramp. A positive electrode input end of the operational amplifier OP is an input end of the LDO power supply circuit 100. An output end of the operational amplifier OP is connected to a gate electrode of the first transistor P1.

A source electrode of the first transistor P1 is configured to connect a power supply voltage VBAT. A drain electrode of the first transistor P1 is an output end of the LDO power supply circuit 100 configured to generate an output voltage $V_{LDO}$ of the LDO power supply circuit 100.

The resistance feedback network 10 is connected between the drain electrode of the first transistor P1 and the positive electrode input end of the operational amplifier OP. The resistance feedback network 10 includes a first branch 101 and a second branch 102, and the first branch 101 and the second branch 102 are connected in parallel. The first branch 101 forms a first feedback coefficient. The second branch 102 forms a second feedback coefficient. The first feedback coefficient is different from the second feedback coefficient. By adopting a design of a circuit structure described above and a combination of the first feedback coefficient and the second feedback coefficient, a rising slope of the output voltage $V_{LDO}$ of the LDO power supply circuit 100 is improved, thereby effectively improving a switching spectrum performance of the power amplifier applying the LDO power supply circuit 100.

Specifically, in the embodiment, the resistance feedback network 10 includes a first resistance R4, a second resistance R5, a third resistance R6, and a second transistor N0.

A first end of the first resistance R4 is connected to the drain electrode of the first transistor P1. A second end of the first resistance R4 is connected to the positive electrode input end of the operational amplifier OP.

A first end of the second resistance R5 is connected to the second end of the first resistance R4. A second end of the second resistance R5 is grounded.

A first end of the third resistance R6 is connected to the second end of the first resistance R4. A second end of the third resistance R6 is connected to a drain electrode of the second transistor N0.

A gate electrode of the second transistor N0 is configured to connect the control voltage Vramp. A source electrode of the second transistor N0 is grounded.

The first resistance R4 and the second resistance R5 jointly form the first branch 101, i.e., the first resistance R4 and the second resistance R5 jointly form the first feedback coefficient. The first resistance R4, the third resistance R6, and the second transistor N0 jointly form the second branch 102, i.e., the first resistance R4, the third resistance R6, and the second transistor N0 jointly form the second feedback coefficient.

In the embodiment, the first transistor P1 is a positive channel metal oxide semiconductor (PMOS) transistor, and the second transistor N0 is an N-Metal-Oxide-Semiconductor (NMOS) transistor.

Optionally, the LDO power supply circuit 100 further includes a voltage stabilizing capacitor C3. A first end of the voltage stabilizing capacitor C3 is connected to the drain electrode of the first transistor P1. A second end of the voltage stabilizing capacitor C3 is grounded. The voltage stabilizing capacitor C3 is a voltage stabilizing capacitor for the output voltage $V_{LDO}$ of the LDO power supply circuit 100 output from the output end of the LDO power supply circuit 100.

Some embodiments of the power amplifier applying the LDO power supply circuit 100 mentioned above are provided below for detailed explanation:

Embodiment 1

Figure 2:
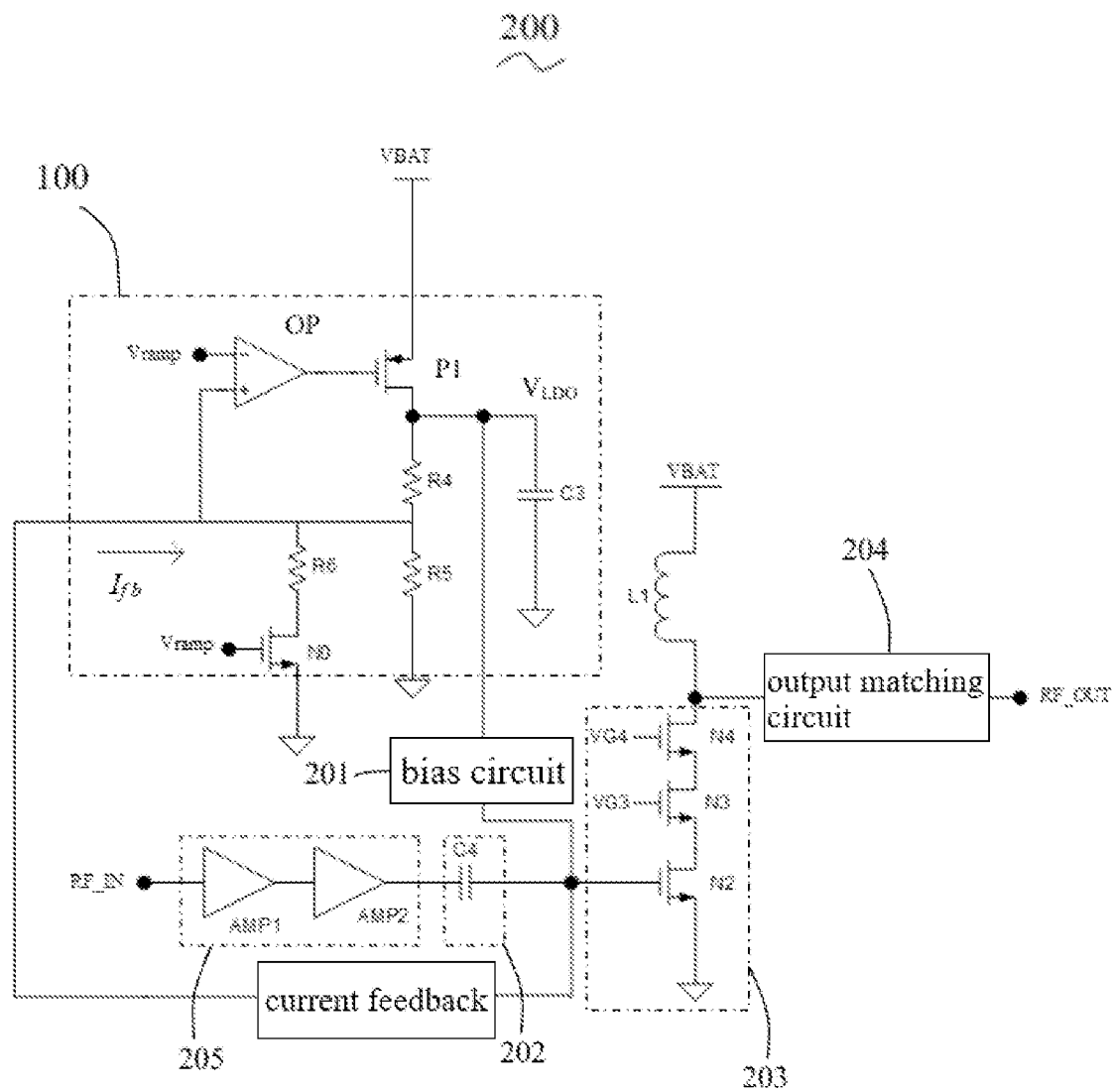
FIG. 2 is a circuit diagram of a power amplifier according to a first embodiment of the present disclosure.

Please refer to FIG. 2, which is a circuit diagram of a power amplifier according to a first embodiment of the present disclosure, the present disclosure provides the power amplifier 200 including a bias circuit 201, an input end RF_IN of the power amplifier 200, an input matching circuit 202, a power amplifier unit 203, an output matching circuit 204, an output end RF_OUT of the power amplifier 200, and the LDO power supply circuit 100 provided by the present disclosure. The input end RF_IN of the power amplifier 200, the input matching circuit 202, the power amplifier unit 203, the output matching circuit 204, and the output end RF_OUT of the power amplifier 200 are connected in sequence. The power amplifier 200 further includes a driver amplifier unit 205, and the driver amplifier unit 205 is connected between the input end RF_IN of the power amplifier 200 and the input matching circuit 202. The input port RF_IN of the power amplifier 200, the driver amplifier unit 205, and the input matching circuit 202 are connected in series.

An output end of the bias circuit 201 is connected to an input end of the power amplifier unit 203. The input end of the LDO power supply circuit 100 is connected to the input end of the power amplifier unit 203. The output end of the LDO power supply circuit 100 is connected to an input end of the bias circuit 201 to form a current feedback control of the power amplifier unit 203.

Specifically, in the embodiment of the present disclosure, the input matching circuit 202 is a second capacitor C4.

A third transistor N2, a fourth transistor N3, and a fifth transistor N4 are connected in parallel to form the power amplifier unit 203. A gate electrode of the third transistor N2 is the input end of the power amplifier unit 203. A source electrode of the third transistor N2 is grounded. A drain electrode of the third transistor N2 is connected to a source electrode of the fourth transistor N3. A gate electrode of the fourth transistor N3 is connected to a first stabilized voltage supply VG3. A drain electrode of the fourth transistor N3 is connected to a source electrode of the fifth transistor N4. A gate electrode of the fifth transistor N4 is connected to a second stabilized voltage supply VG4. A drain electrode of the fifth transistor N4 is an output end of the power amplifier unit 203.

The driver amplifier unit 205 includes a first drive amplifier AMP1 and a second drive amplifier AMP2. The first drive amplifier AMP1 and the second drive amplifier AMP2 are connected in sequence.

Optionally, the power amplifier 200 further includes a choke inductor L1. A first end of the choke inductor L1 is connected to the power supply voltage VBAT. A second end of the choke inductor L1 is connected to the output end of the power amplifier unit 203.

When the control voltage Vramp is low, a proportional relationship between the output voltage $V_{LDO}$ of the LDO power supply circuit 100 and the control voltage Vramp is:

$$V_{LDO}=(1+R_4/R_5)\times Vramp-R_4\times I_{fb}$$

$I_{fb}$ is a feedback current that outputs to the output end of the LDO power supply circuit 100.

When the control voltage Vramp rises to turn on the second transistor N0, a feedback value of the output voltage $V_{LDO}$ of the LDO power supply circuit 100 is:

$$V_{LDO}=(1+R_4/(R_6+R_n)//R_5)\times Vramp-R_4\times I_{fb}$$

Generally, the resistances satisfy $R_5>R_6+R_n$, where $R_n$ is the resistance of the second transistor N0, and the above formula may be simplified to be:

$$V_{LDO}\approx(1+R_4/(R_6+R_n))\times Vramp-R_4\times I_{fb}$$

When the control voltage Vramp rises to be greater, more than 1V and the resistance of the second transistor N0 is small, and $R_n$ can be ignored. The feedback value of the output voltage $V_{LDO}$ of the LDO power supply circuit 100 is:

$$V_{LDO}\approx(1+R_4/R_6)\times Vramp-R_4\times I_{fb}$$

The resistances satisfy $R_5>R_6+R_n>R_6$. Therefore, as the control voltage Vramp rises from low to high, the feedback value of the output voltage $V_{LDO}$ of the LDO power supply circuit 100 is gradually increased. A principle of optimizing the switching spectrum of the power amplifier is as follows: when the control voltage Vramp is low, an internal circuit is in a low voltage state, and a voltage value and the slope of the output voltage $V_{LDO}$ of the LDO power supply circuit 100 must be small to obtain a good switching spectrum performance of the power amplifier.

Figure 3:
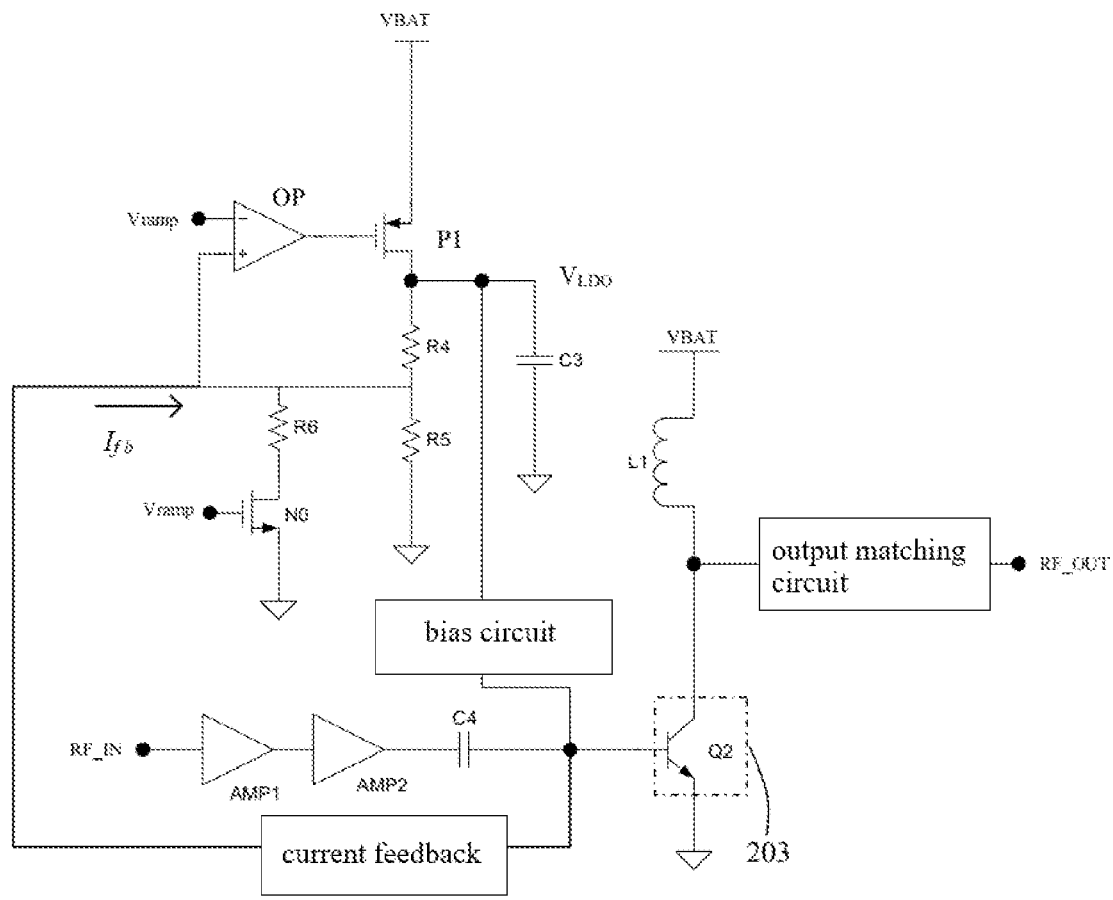
FIG. 3 is another circuit diagram of the power amplifier according to the first embodiment of the present disclosure.

In the embodiment of the present disclosure, the power amplifier unit of the power amplifier is an N-type power amplifier triode Q2. As shown in FIG. 3, which is another circuit diagram of the power amplifier according to the first embodiment of the present disclosure, and the power amplifier shown in FIG. 3 is basically same as the power amplifier shown in FIG. 2, except that a structure of the power amplification unit described above is different, and the principle thereof is same, and details are not described herein again.

Figure 4:
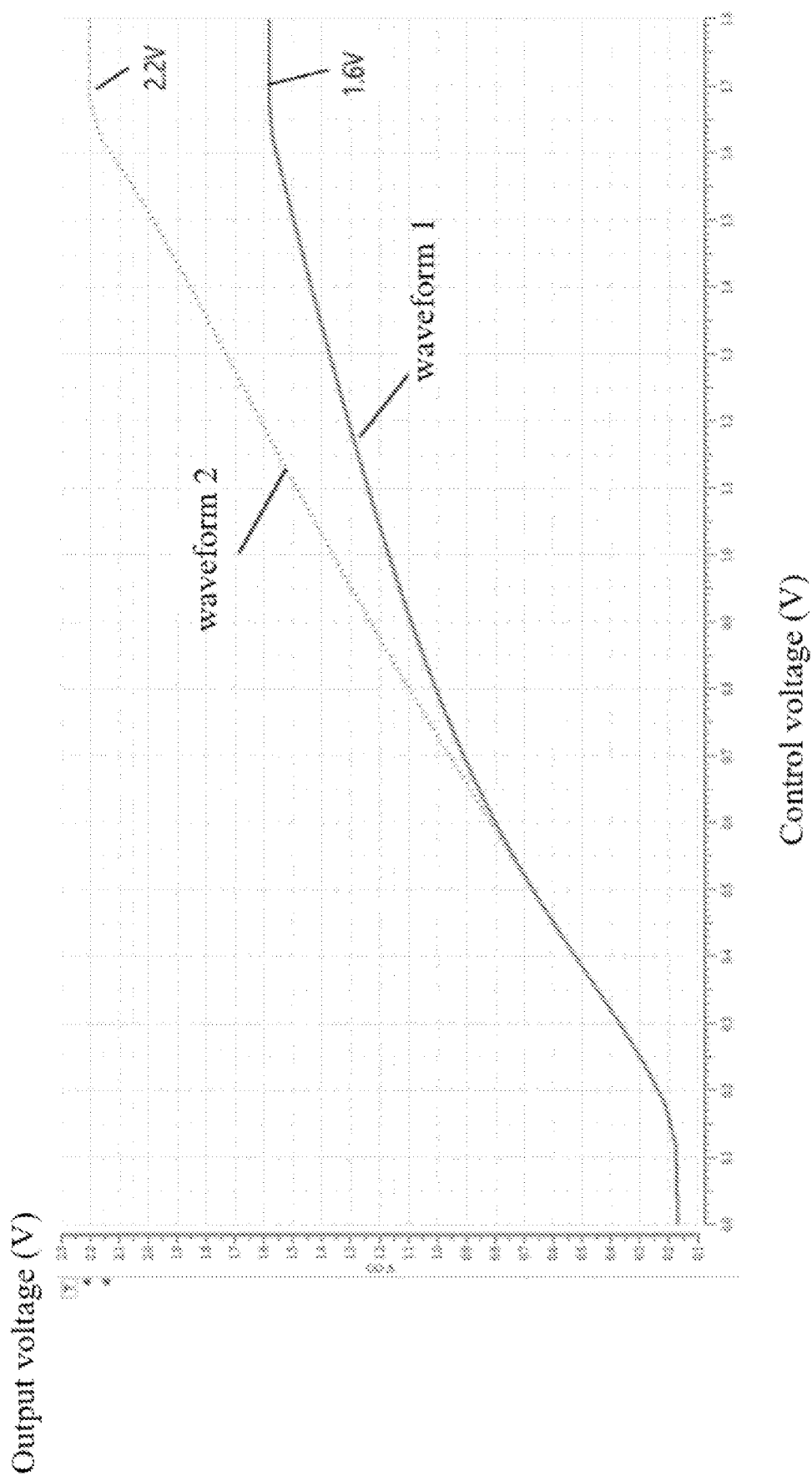
FIG. 4 is a power output simulation diagram of the power amplifier according to the first embodiment of the present disclosure.

As shown in FIG. 4, FIG. 4 is a power output simulation diagram of the power amplifier according to the first embodiment of the present disclosure. Through simulation, it should be noted that, the power amplifier in the prior art only uses a single feedback coefficient, i.e., the power amplifier does not use a circuit of the second transistor N0 and the third resistor R6, and a power output waveform of the power amplifier is as shown in a curve of a waveform 1, and the output voltage $V_{LDO}$ of the LDO power supply circuit 100 reaches up to 1.6 V.

However, the power amplifier of the present disclosure adopts the combination of the first feedback coefficient and the second feedback coefficient, i.e., after the power amplifier uses the circuit of the second transistor N0 and the third resistor R6, the power output waveform of the power amplifier is shown as a curve of a waveform 2, and the output voltage $V_{LDO}$ of the LDO power supply circuit 100 reaches up to 2.2 V. A higher output voltage $V_{LDO}$ of the LDO power supply circuit 100 means that the power amplifier can provide a higher power output.

When the control voltage Vramp is low, the curve of the waveform 1 and the curve of the waveform 2 basically coincide and reach a same slope. Therefore, the curve of the waveform 2 has a slow rise when the control voltage Vramp is low, thereby ensuring the good switching spectrum performance of the power amplifier. When the control voltage Vramp is relatively high, the output voltage $V_{LDO}$ of the LDO power supply circuit 100 is high, thereby ensuring a high output power of the power amplifier.

Compared with the prior art, the power amplifier of the present disclosure adopts the combination of the first feedback coefficient and the second feedback coefficient, i.e., the power amplifier uses the circuit of the second transistor N0 and the third resistor R6, the high output power of the power amplifier can be obtained under a condition of ensuring a certain switching spectrum performance of the power amplifier.

Embodiment 2

Figure 5:
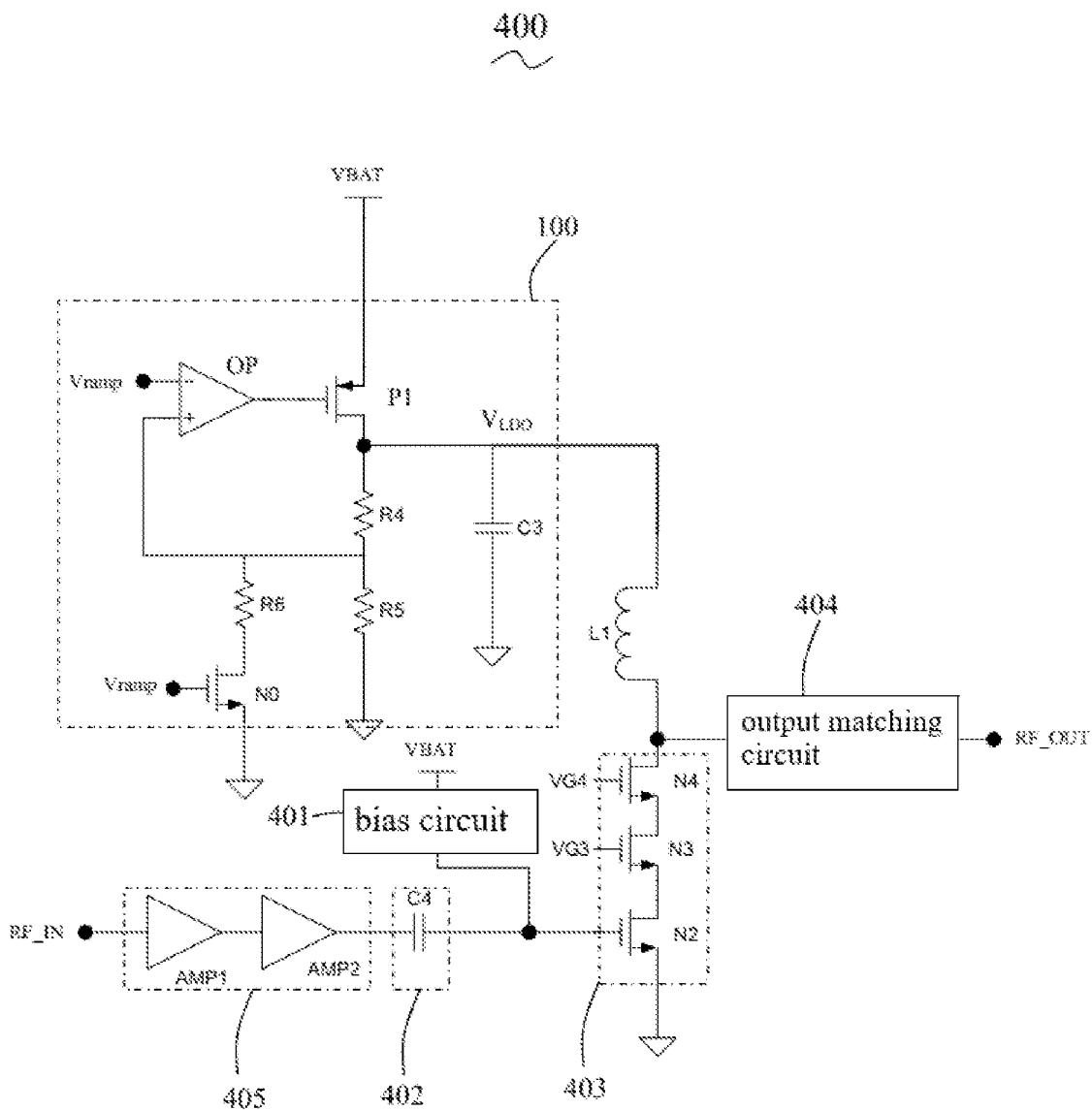
FIG. 5 is a circuit diagram of the power amplifier according to a second embodiment of the present disclosure.

Please refer to FIG. 5, which is a circuit diagram of the power amplifier according to a second embodiment of the present disclosure. In the embodiment of the present disclosure, a circuit structure of the power amplifier is basically same as the circuit structure of the power amplifier of the first embodiment, and a difference between the first embodiment and the second embodiment lies in a control method of the LDO power supply circuit 100, i.e., a connection method of the LDO power supply circuit 100 connected to the power amplifier in first embodiment is different from the connection method of the LDO power supply circuit 100 connected to the power amplifier in second embodiment, which is specifically as follows:

The power amplifier 400 includes a bias circuit 401, the input end RF_IN of the power amplifier 400, an input matching circuit 402, a power amplifier unit 403, an output matching circuit 404, the output end RF_OUT of the power amplifier 400, and the LDO power supply circuit 100 provided by the present disclosure. The input end RF_IN of the power amplifier 400, the input matching circuit 402, the power amplifier unit 403, the output matching circuit 404, and the output end RF_OUT of the power amplifier 400 are connected in sequence. The power amplifier 400 further includes a driver amplifier unit 405, and the driver amplifier unit 405 is connected between the input end RF_IN of the power amplifier and the input matching circuit 402. The input end RF_IN of the power amplifier 400, the driver amplifier unit 405, and the input matching circuit 402 are connected in series.

The output end of the bias circuit 401 is connected to the input end of the power amplifier unit 403. The input end of the bias circuit 401 is connected to the power supply voltage VBAT. The output end of the LDO power supply circuit 100 is connected to the output end of the power amplifier unit 403 to form a voltage feedback control of the power amplifier unit 403.

In the embodiment of the present disclosure, the power amplifier 400 further includes the choke inductor L1. The output end of the LDO power supply circuit 100 is connected in series with the choke inductor L1, and the output end of the LDO power supply circuit 100 is connected to the output end of the power amplifier unit 403.

The principle of optimizing the switching spectrum of the power amplifier is as follows: when the control voltage Vramp is low, the internal circuit is in the low voltage state, and the voltage value of the output voltage $V_{LDO}$ of the LDO power supply circuit 100 and the slope of the output voltage $V_{LDO}$ of the LDO power supply circuit 100 must be small to obtain a good switching spectrum performance of the power amplifier. When the control voltage Vramp is high, the output voltage $V_{LDO}$ rises to provide power to the power amplifier 400, so that the power amplifier 400 reaches a required output power. When the control voltage Vramp is high, if a relatively low feedback value of the output voltage $V_{LDO}$ of the LDO power supply circuit 100 is still used, the low output voltage $V_{LDO}$ of the LDO power supply circuit 100 is low, resulting in a low output power of the power amplifier 400 that cannot meet requirements of the output power of the power amplifier 400. However, in the embodiment of the present disclosure, a high, a medium or a low feedback value of the output voltage $V_{LDO}$ of the LDO power supply circuit 100 satisfies requirements for the output power of the power amplifier and the switching spectrum of the power amplifier.

In addition to the differences mentioned above, and other features in the second embodiment are same as that in the first embodiment, and details are not described herein again.

Figure 6:
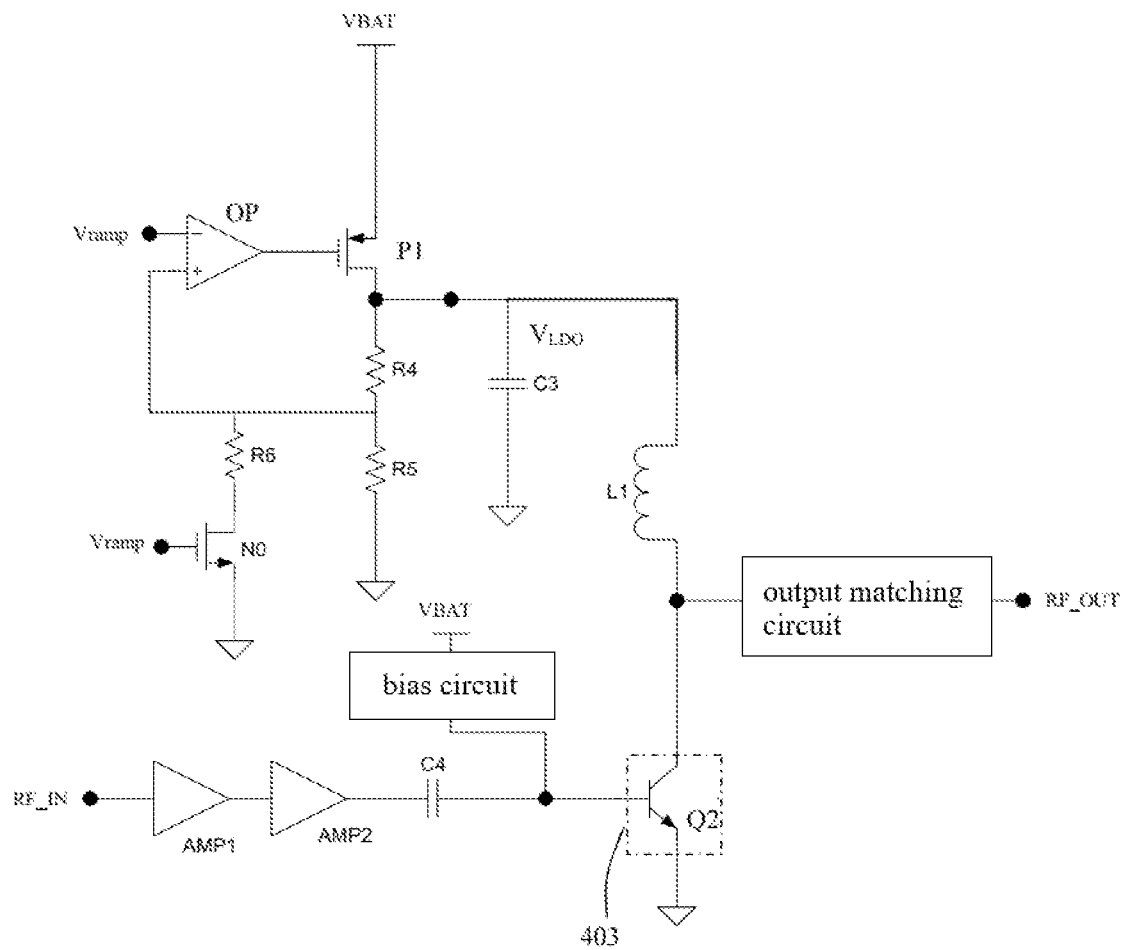
FIG. 6 is another circuit diagram of the power amplifier according to the second embodiment of the present disclosure.

In the embodiment of the present disclosure, the power amplifier unit 403 of the power amplifier 400 is an N-type power amplifier triode Q2. As shown in FIG. 6, which is a second circuit diagram of the power amplifier according to second embodiment of the present disclosure, and the power amplifier shown in FIG. 6 is basically same as the power amplifier shown in FIG. 5, except that the structure of the power amplification unit described above is different, but the principle of optimizing the switching spectrum of the power amplifier is same, and details are not described herein again.

Compared with the prior art, the present disclosure provides the LDO power supply circuit 100 and the power amplifier, in which the resistance feedback network is connected between the drain electrode of the first transistor and the positive electrode input end of the operational amplifier in the LDO power supply circuit 100. The resistance feedback network includes the first branch and the second branch, and the first branch and the second branch are connected in parallel. The first branch forms the first feedback coefficient. The second branch forms the second feedback coefficient. The first feedback coefficient is different from the second feedback coefficient. By adopting a combination of the first feedback coefficient and the second feedback coefficient, a rising slope of an output voltage $V_{LDO}$ of the LDO power supply circuit 100 is improved, thereby effectively improving the switching spectrum performance of the power amplifier applying the LDO power supply circuit 100.

The embodiments described above with reference to the accompanying drawings are used only to illustrate and not to limit the scope of the present disclosure. It should be noted that, for the person of ordinary skill in the art, improvements are made without departing from concepts of the present disclosure, but these are all within the protection scope of the present disclosure. In addition, unless context of the present disclosure indicates otherwise, words appearing in the singular include plural forms, and vice versa. Besides, all or a portion of any embodiment may be used in combination with all or a portion of any other embodiment, unless specifically stated.

What is claimed is:

1. A low dropout regulator (LDO) power supply circuit, comprising:
   an operational amplifier;
   a first transistor; and
   a resistance feedback network;
   wherein a negative electrode input end of the operational amplifier is configured to connect a control voltage; a positive electrode input end of the operational amplifier is an input end of the LDO power supply circuit; an output end of the operational amplifier is connected to a gate electrode of the first transistor;
   a source electrode of the first transistor is configured to connect a power supply voltage; a drain electrode of the first transistor is an output end of the LDO power supply circuit;
   the resistance feedback network is connected between the drain electrode of the first transistor and the positive electrode input end of the operational amplifier; the resistance feedback network comprises a first branch and a second branch, and the first branch and the second branch are connected in parallel; the first branch forms a first feedback coefficient; the second branch forms a second feedback coefficient; the first feedback coefficient is different from the second feedback coefficient;
   the resistance feedback network comprises a first resistance, a second resistance, a third resistance, and a second transistor;
   a first end of the first resistance is connected to the drain electrode of the first transistor; a second end of the first resistance is connected to the positive electrode input end of the operational amplifier;
   a first end of the second resistance is connected to the second end of the first resistance; a second end of the second resistance is grounded;
   a first end of the third resistance is connected to the second end of the first resistance; a second end of the third resistance is connected to a drain electrode of the second transistor:
   a gate electrode of the second transistor is configured to connect the control voltage; a source electrode of the second transistor is grounded; and
   the first resistance and the second resistance jointly form the first branch; the first resistance, the third resistance, and the second transistor jointly form the second branch.

2. The LDO power supply circuit according to claim 1, wherein the first transistor is a positive channel metal oxide semiconductor (PMOS) transistor; the second transistor is an N-Metal-Oxide-Semiconductor (NMOS) transistor.

3. The LDO power supply circuit according to claim 1, wherein the LDO power supply circuit further comprises a voltage stabilizing capacitor; a first end of the voltage stabilizing capacitor is connected to the drain electrode of the first transistor; a second end of the voltage stabilizing capacitor is grounded.

4. A power amplifier, comprising:
   a bias circuit;
   an input end of the power amplifier;
   an input matching circuit;
   a power amplifier unit;
   an output matching circuit; and
   an output end of the power amplifier;
   wherein the input end of the power amplifier, the input matching circuit, the power amplifier unit, the output matching circuit, and the output end of the power amplifier are connected in sequence; an output end of the bias circuit is connected to an input end of the power amplifier unit; and
   the power amplifier further comprises the LDO power supply circuit according to claim 1; the input end of the LDO power supply circuit is connected to the input end of the power amplifier unit; the output end of the LDO power supply circuit is connected to an input end of the bias circuit to form a current feedback control of the power amplifier unit.

5. The power amplifier according to claim 4, wherein the power amplifier further comprises a choke inductor; a first end of the choke inductor is connected to the power supply voltage; a second end of the choke inductor is connected to an output end of the power amplifier unit.

6. A power amplifier, comprising:
   a bias circuit;
   an input end of the power amplifier;
   an input matching circuit;
   a power amplifier unit;
   an output matching circuit; and
   an output end of the power amplifier;
   wherein the input end of the power amplifier, the input matching circuit, the power amplifier unit, the output matching circuit, and the output end of the power amplifier are connected in sequence; an output end of the bias circuit is connected to the input end of the power amplifier unit; the power amplifier further comprises the LDO power supply circuit according to claim 1; an input end of the bias circuit is connected to the power supply voltage; the output end of the LDO power supply circuit is connected to the output end of the power amplifier unit to form a voltage feedback control of the power amplifier unit.

7. The power amplifier according to claim 6, wherein the power amplifier further comprises the choke inductor; the output end of the LDO power supply circuit is connected in series with the choke inductor, and the output end of the LDO power supply circuit is connected to the output end of the power amplifier unit.

8. The power amplifier according to claim 6, wherein a third transistor, a fourth transistor, and a fifth transistor are connected in parallel to form the power amplifier unit.

9. The power amplifier according to claim 6, wherein the power amplifier unit is an N-type power amplifier triode.

* * * * *